(12) United States Patent
Ohgishi

(10) Patent No.: US 7,943,446 B2
(45) Date of Patent: May 17, 2011

(54) METHOD OF PRODUCING SEMICONDUCTOR DEVICE AND SEMICONDUCTOR DEVICE

(75) Inventor: Yuko Ohgishi, Tokyo (JP)

(73) Assignee: Sony Corporation, Tokyo (JP)

(*) Notice: Subject to any disclaimer, the term of this patent is extended or adjusted under 35 U.S.C. 154(b) by 1035 days.

(21) Appl. No.: 11/622,642

(22) Filed: Jan. 12, 2007

(65) Prior Publication Data

US 2008/0199994 A1 Aug. 21, 2008

Related U.S. Application Data

(62) Division of application No. 10/806,588, filed on Mar. 23, 2004, now Pat. No. 7,205,619.

(30) Foreign Application Priority Data

Mar. 26, 2003 (JP) .............................. P2003-084475

(51) Int. Cl.
*H01L 21/00* (2006.01)
*H01L 21/84* (2006.01)
*H01L 21/336* (2006.01)
*H01L 21/8242* (2006.01)

(52) U.S. Cl. ........ 438/162; 438/210; 438/239; 438/241; 438/275; 438/287; 438/585; 438/587; 257/E21.637; 257/E21.639; 257/E21.177; 257/E21.623; 257/E21.625

(58) Field of Classification Search .................. 438/162, 438/241
See application file for complete search history.

(56) References Cited

U.S. PATENT DOCUMENTS

| | | | | | |
|---|---|---|---|---|---|
| 5,773,848 | A | * | 6/1998 | Wu et al. | 257/72 |
| 5,834,352 | A | * | 11/1998 | Choi | 438/275 |
| 5,851,889 | A | * | 12/1998 | Michael et al. | 438/301 |
| 6,057,572 | A | * | 5/2000 | Ito et al. | 257/296 |
| 6,090,654 | A | * | 7/2000 | Kim | 438/238 |
| 6,127,216 | A | * | 10/2000 | Yu | 438/238 |
| 6,333,541 | B1 | * | 12/2001 | Matsuoka et al. | 257/391 |
| 6,503,788 | B1 | * | 1/2003 | Yamamoto | 438/231 |
| 6,524,902 | B2 | * | 2/2003 | Rhee et al. | 438/199 |
| 6,858,900 | B2 | * | 2/2005 | Chen et al. | 257/360 |
| 7,022,559 | B2 | * | 4/2006 | Barnak et al. | 438/153 |
| 2002/0052086 | A1 | * | 5/2002 | Maeda | 438/283 |
| 2002/0072182 | A1 | * | 6/2002 | Ha et al. | 438/301 |
| 2002/0130393 | A1 | * | 9/2002 | Takayanagi et al. | 257/616 |
| 2003/0109087 | A1 | * | 6/2003 | Dong et al. | 438/158 |
| 2004/0043558 | A1 | * | 3/2004 | Wieczorek et al. | 438/241 |

* cited by examiner

*Primary Examiner* — Charles Garber
*Assistant Examiner* — Pape Sene
(74) *Attorney, Agent, or Firm* — SNR Denton US LLP

(57) ABSTRACT

A semiconductor device able to secure electrical effective thicknesses required for insulating films of electronic circuit elements by using depletion of electrodes of the electronic circuit elements even if the physical thicknesses of the insulating films are not different, where gate electrodes of high withstand voltage use transistors to which high power source voltages are supplied contain an impurity at a relatively low concentration, so the gate electrodes are easily depleted at the time of application of the gate voltage; depletion of the gate electrodes is equivalent to increasing the thickness of the gate insulating films; the electrical effective thicknesses required of the gate insulating films can be made thicker; and the gate electrodes of high performance transistors for which a high speed and large drive current are required do not contain an impurity at a high concentration where depletion of the gate electrodes will not occur, so the electrical effective thickness of the gate insulating films is kept thin.

11 Claims, 19 Drawing Sheets

METHOD OF PRODUCING SEMICONDUCTOR DEVICE AND SEMICONDUCTOR DEVICE

RELATED APPLICATION DATA

This application is a divisional of and claims the benefit of priority to U.S. application Ser. No. 10/806,588, filed Mar. 23, 2004, now U.S. Pat. No. 7,205,619, which is incorporated herein by reference to the extent permitted by law. This application also claims the benefit of priority to Japanese Patent Applications P2003-084475, filed Mar. 26, 2003, which is also incorporated herein by reference to the extent permitted by law.

BACKGROUND OF THE INVENTION

1. Field of the Invention

The present invention relates to a method of producing a semiconductor device and to a semiconductor device, more particularly relates to a method of producing a semiconductor device having MIS transistors, capacitors, or other different types of elements with different power source voltages formed on a same substrate and to a semiconductor device having the same.

2. Description of the Related Art

Recently, in general, in LSI processes, circuits are being made higher in integration and elements are being miniaturized more. Along with this, it is required that MIS transistors, capacitors, resistance elements, and other different types of elements having different power source voltages is simultaneously formed on the same substrate as much as possible without increasing the number of steps.

Further, to improve the performance of MIS transistors, more miniaturization is required. Along with the drop in the power source voltage due to this, gate insulating films are also being made thinner. Even if the main MIS transistors are formed by thin films, the MIS transistors supplied with high voltages used for example for I/O parts, analog circuits, etc. require thicker insulating films commensurate with those power source voltages.

The general practice is to form such MIS transistors, for example, MOS transistors, having different voltages with separate gate insulating films. As an example of a method of formation, for example, a heat oxide film is formed on a semiconductor substrate, a photo resist or other mask is formed only on regions for forming a thick gate oxide film, and the exposed parts of the heat oxide film are removed by wet etching using a hydrofluoric acid solution etc. The resist is removed, then the semiconductor substrate is heat oxidized a second time to form a heat oxide film. As a result, gate oxide films having different thicknesses are formed.

With the above method, by repeating the photo resist patterning step, the wet-etching step, and the heat-oxidation step, it is possible to obtain as many different types of thicknesses of heat oxide films as desired.

Further, in the past, the technique of simultaneously forming capacitors when forming MOS transistors has been used. As the method of formation, for example, a semiconductor substrate is doped with a high concentration of ions through a suitable sacrificial oxide film to make the silicon substrate an $n^+$ or $p^+$ type and form capacitor electrodes. The sacrificial film is removed, then heat oxidation is used to form a capacitive oxide film of the capacitors with desired oxide film thickness at the same time as the gate oxide film of the MOS transistors. In this oxidation step, the oxidation proceeds faster than normal due to crystal defects formed in the substrate by the ions previously implanted at a high concentration (accelerated oxidation). As a result, the capacitive oxide film of the capacitors becomes thicker than the gate oxide film. As following steps, polycrystalline silicon is deposited and patterned so as to form other electrodes of the capacitors at the same time as gate electrodes of the MOS transistors.

With the above method, it is possible to efficiently form the capacitors on the same substrate at the same time as the MOS transistors without greatly increasing the number of steps.

On the other hand, it is known that by making the concentration of impurities in a gate electrode high, depletion under the gate electrodes is prevented (Japanese Unexamined Patent Publication (Kokai) No. 2000-277636).

The above methods for selective formation of oxide films, however, first had the problem that the number of steps increased along with the number of types of thicknesses of the oxide films. Further, at the time of wet etching, the hydrofluoric acid solution etc. infiltrated the edges of the masked oxide film and ends up damaging the oxide film supposed to remain. This may influence the elements and lower the reliability. Therefore, it is not preferable to use these methods frequently.

In case of the method of formation of capacitors, the silicon substrate is doped with ions to a high concentration to form the electrodes. To obtain the desired capacity, it may be to promote accelerated oxidation to obtain a thick oxide film able to withstand a high voltage. However, if implanting ions at a particularly high concentration to promote accelerated oxidation, the damage given to the silicon substrate becomes greater, therefore the quality of the oxide film is lowered and the reliability ends up being reduced. Further, the ratio of poor quality film due to the accelerated oxidation increases and becomes a cause of a drop in reliability.

As explained above, raising the performance of the main MOS transistors of an LSI requires that the thickness of the gate oxide film is made physically thin. This oxide film has to maintain the thin thickness of the electrical effective oxide film when operating the transistors as it is. Therefore, it is necessary to satisfy the requirements of all of the thin film transistors, transistors with different power sources, capacitors, and other elements requiring different oxide film thicknesses.

SUMMARY OF THE INVENTION

A first object of the present invention is to provide a semiconductor device able to secure electrical effective thicknesses required for insulating films of electronic circuit elements by using depletion of electrodes of the electronic circuit elements even if the physical thicknesses of the insulating films are not different.

A second object of the present invention is to provide a method of producing a semiconductor device able to secure electrical effective thicknesses required for gate oxide films of transistors and capacitive insulating films of capacitors while keeping down the increase in number of steps due to the selective formation of insulating films with physically different thicknesses.

To achieve the first object, according to a first aspect of the invention, there is provided a semiconductor device having a semiconductor substrate and a plurality of electronic circuit elements formed at parts of the semiconductor substrate for each electrically independent region and including insulating films and electrodes formed on the insulating films, the insulating films differing in required electrical effective thickness for each electronic circuit element, and the electrodes having different concentrations of impurities for each electronic circuit element according to the effective thickness.

According to the semiconductor device of the present invention, the electrodes of each electronic circuit element have a different concentration of impurities according to the effective thickness of the insulating film. Therefore, the effective thickness is controlled by depletion of the electrodes due to the concentration of impurities.

To achieve the second object, according to a second aspect of the invention, there is provided a method of producing a semiconductor device for forming gate electrodes of a plurality of transistors supplied with different voltages on a semiconductor substrate via a gate insulating film, having the steps of forming the gate insulating film on the semiconductor substrate; forming a gate electrode layer containing an impurity on the gate insulating film; implanting an impurity at regions of the gate electrode layer for forming transistors where the electrical effective thickness required of the gate insulating film based on the voltage is relatively thin; and processing the gate electrode layer to form gate electrodes with concentrations of impurities differing for each transistor.

According to the method of producing a semiconductor device of the present invention, an impurity is implanted into the regions of the gate electrode layer for forming transistors where the effective thickness of the gate insulating films based on the power source voltage able to be supplied is relatively thin. Therefore, a gate electrode formed by processing the gate electrode layer in a region where no impurity was introduced at this time has a relatively low concentration of impurity, so the effective thickness of the gate insulating film becomes thicker due to depletion of the gate electrode. On the other hand, a gate electrode in which the above impurity was introduced has a relatively high concentration of impurity, so depletion of the gate electrode is prevented and the electrical effective thickness is kept thin.

Further, to achieve the second object, according to a third aspect of the invention, there is provided a method of producing a semiconductor device for forming gate electrodes of transistors and upper electrodes of capacitors via insulating films on a semiconductor substrate, having the steps of forming lower electrodes of the capacitors in the semiconductor substrate; forming an insulating film for forming gate insulating films of the transistors and capacitive insulating films of the capacitors on the semiconductor substrate and the lower electrodes; forming an electrode layer containing an impurity for forming the gate electrodes and the upper electrodes on the insulating film; implanting an impurity at regions of the electrode layer for forming transistors where the effective thickness required of the insulating film is relatively thin compared with the capacitors; and processing the electrode layer to form the gate electrodes and the upper electrodes having different concentrations of impurities.

According to the method of producing a semiconductor device of the present invention, an impurity is introduced into the regions of the electrode layer for forming transistors with effective thicknesses of the insulating layer thinner compared with the capacitors. Therefore, a capacitive electrode formed by processing the electrode layer in a region where no impurity was introduced at this time has a relatively low concentration of impurity, so the effective thickness of the capacitive insulating film becomes thicker due to depletion of the capacitive electrode. On the other hand, a gate electrode in which the above impurity was introduced has a relatively high concentration of impurity, so depletion of the gate electrode is prevented and the electrical effective thickness is kept thin.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Hereinafter, semiconductor devices and methods of producing the same of embodiments of the present invention will be described with reference to the accompanying drawings.

First Embodiment

Figure 1:
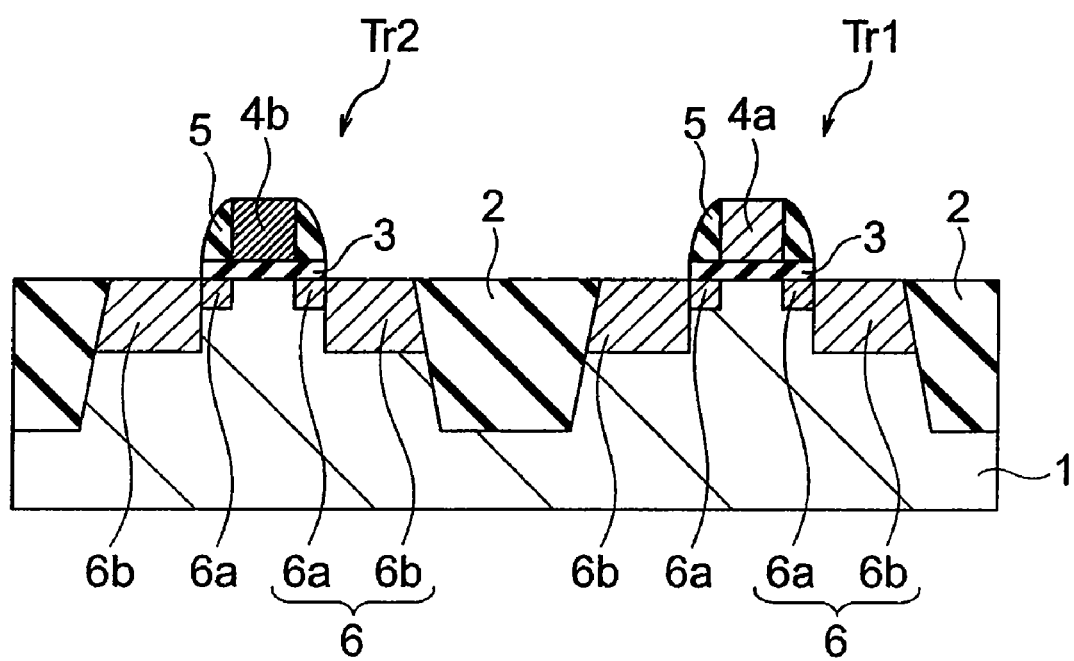
FIG. 1 is a cross-sectional view of an example of a semiconductor device according to a first embodiment.

FIG. 1 is a cross-sectional view of a semiconductor device according to the present invention. As shown in FIG. 1, a semiconductor substrate 1 having, for example, silicon is formed with an element-isolation insulating film 2 of silicon oxide defining active regions. The active regions of the semiconductor substrate 1 are formed with two transistors Tr1 and Tr2 to which different power source voltages are supplied. The transistor Tr1 is used as a transistor to which a high power source voltage is supplied, while the transistor Tr2 is made a high performance transistor having high speed and large drive current.

That is, gate electrodes 4a and 4b of the transistors Tr1 and Tr2 are formed on the semiconductor substrate 1 via gate insulating films 3. The side parts of the gate electrodes 4a and 4b are formed with sidewall insulating films 5 of for example silicon oxide. In this embodiment, the physical thicknesses of the gate electrodes 3 of the transistors Tr1 and Tr2 are substantially the same. The gate electrode 4a is formed by a polycrystalline silicon layer containing an impurity in a low concentration compared with the gate electrode 4b, i.e., the gate electrode 4b is formed by a polycrystalline silicon layer containing an impurity in a high concentration compared with the gate electrode 4a.

$n^-$ semiconductor regions 6a in which an impurity is introduced in a low concentration are formed in the semiconductor substrate 1 directly under the sidewall insulating films 5 of the transistors Tr1 and Tr2, while $n^+$ semiconductor regions 6b in which an impurity is introduced in a high concentration compared with the $n^-$ semiconductor regions 6a are formed in the semiconductor substrate 1 at the outside of the semiconductor regions 6a. In this way, source/drain regions 6 of lightly doped drain (LDD) structures are formed from the n⁻ semiconductor regions 6a and the n⁺ semiconductor regions 6b.

In the semiconductor device according to the present embodiment, since the gate electrode 4a of the high withstand voltage use transistor Tr1 to which a high power source voltage is supplied contains an impurity at a low concentration compared with the gate electrode 4b, depletion of the gate electrode 4a easily occurs when supplying the gate voltage. This depletion of the gate electrode 4a is equivalent to increasing the thickness of the gate insulating film 3. The high withstand voltage use transistor Tr1 requires a thick gate insulating film 3. By utilizing the depletion of the gate electrode 4a, it is possible to make the electrical effective thickness required from the gate insulating film 3 thicker.

On the other hand, the gate electrode 4b of the high performance transistor Tr2 required to have a high speed and large drive current contains an impurity in a high concentration compared with the gate electrode 4a so that depletion of the gate electrode 4b does not occur. As a result, the effective thickness of the gate insulating film 3 is also kept thin. Therefore, it is possible to prevent obstruction of the high speed operation caused by depletion of the gate electrode and realize a high speed and large drive current.

Next, a method of producing a semiconductor device according to the present embodiment will be described with reference to FIGS. 2A to 2F.

Figure 2A:
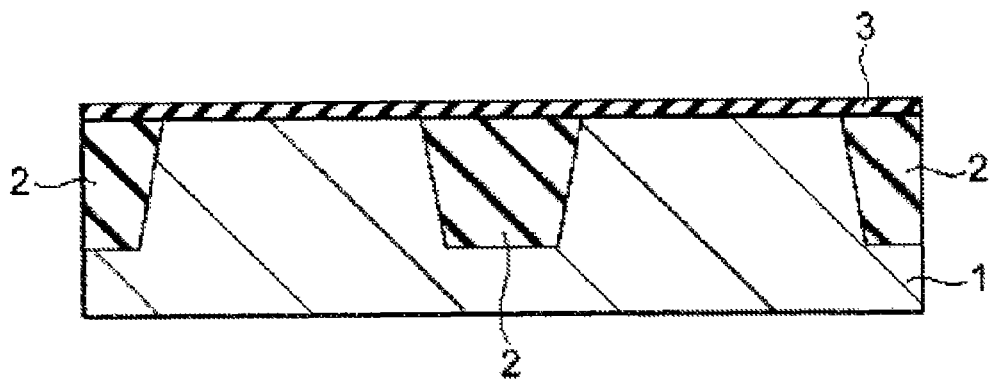
FIGS. 2A to 2F are cross-sectional views of steps of producing a semiconductor device according to the first embodiment.

First, as shown in FIG. 2A, a semiconductor substrate 1 separated into active regions by an element-isolation insulating film 2 formed by local oxidation of silicon (LOCOS) or shallow trench isolation (STI) is formed with a gate insulating film 3 of, for example, about 2 nm by heat oxidation. The oxidation conditions at this time are determined so that the oxide film thickness becomes a thin film suitable for the elements requiring the highest performance.

Figure 2B:
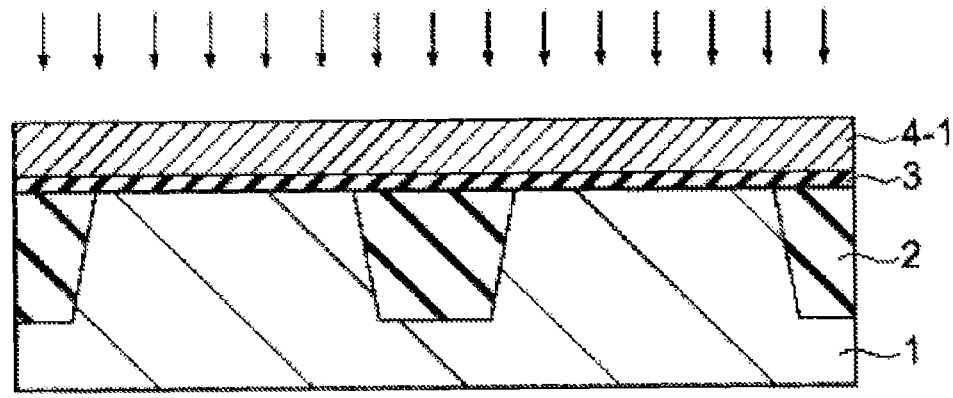

Next, as shown in FIG. 2B, an amorphous silicon film 4-1 is formed. The thickness of the silicon film 4-1 is made for example about 50 to 200 nm. Next, gate ions are implanted for forming an n⁺ electrode. The gate ion implantation is for example implantation of P by an implantation energy of 20 keV and a dosage of $1\times10^{15}$ cm⁻². The dosage at this time is set to a concentration facilitating gate depletion for an element where a thick gate insulating film is required such as a transistor Tr1 for a high power source voltage.

Figure 2C:
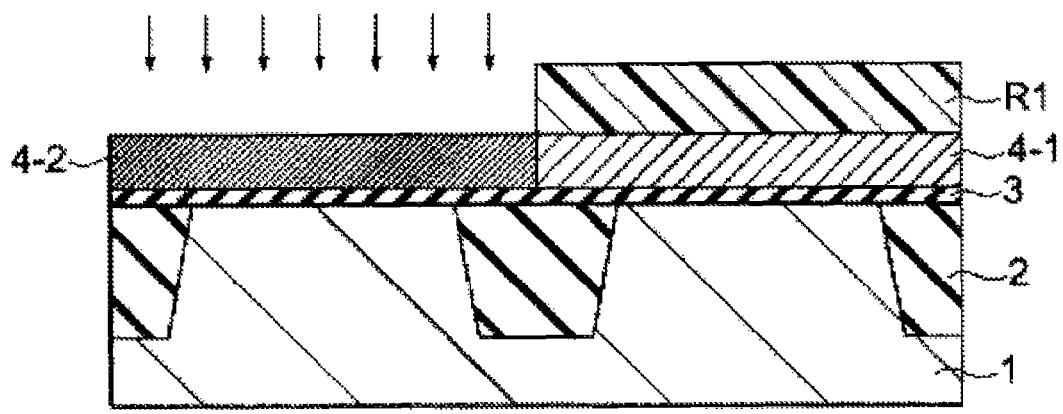

Next, as shown in FIG. 2C, a resist R1 opened at a region including the gate electrode of the transistor Tr2 from which the highest performance is sought is patterned. Using this resist R1 as a mask, addition gate ions are implanted. Therefore, a silicon film 4-2 containing an impurity in a high concentration is formed. This additional gate ion implantation is for example implantation of P at an implantation energy of 20 keV and a dosage of $3\times10^{15}$ cm⁻². The dosage at this time is set to one of a concentration high enough to make gate depletion difficult so as to prevent the electrical effective thickness of the gate insulating film required of the transistor Tr2 where the highest performance is sought from becoming greater. The resist R1 is removed, then introduced impurity is activated by heating. Due to the heat treatment, the amorphous silicon films 4-1 and 4-2 become polycrystalline silicon.

Figure 2D:
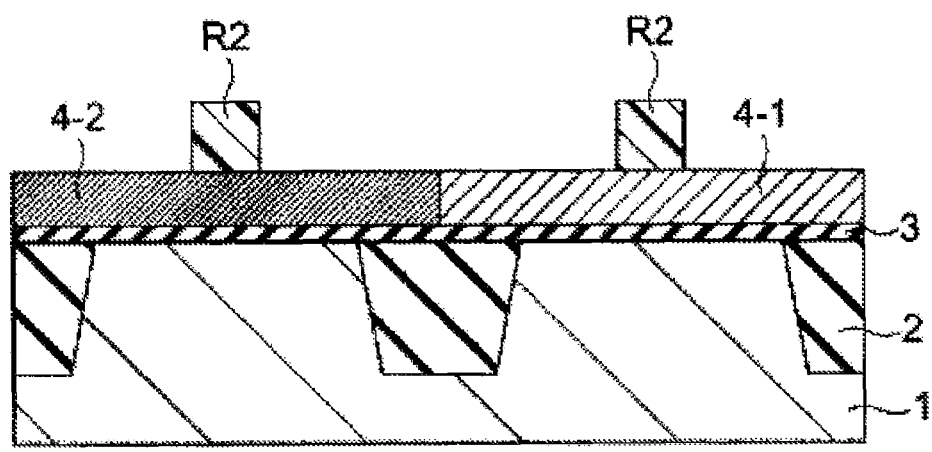
Figure 2E:
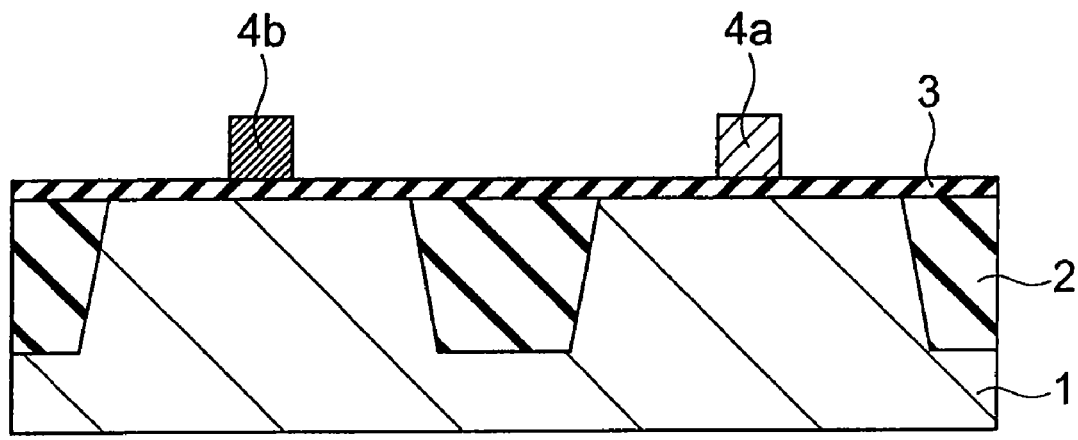

Next, as shown in FIG. 2D, the parts for forming the gate electrodes of the transistors Tr1 and Tr2 are masked by a resist R2, then, as shown in FIG. 2E, the silicon films 4-1 and 4-2 are dry-etched using the resist R2 as a mask. After that, the resist R2 is removed. Due to this, the gate electrode 4a of the silicon film 4-1 containing an impurity in a low concentration and the gate electrode 4b of the silicon film 4-2 containing an impurity in a high concentration by two ion implantations are formed.

Figure 2F:
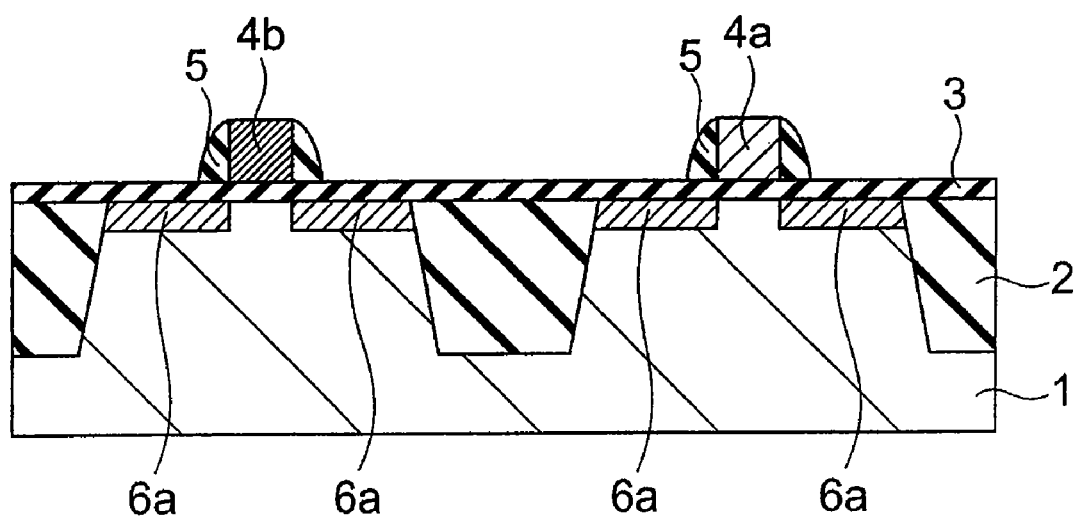

Next, as shown in FIG. 2F, using the gate electrodes 4a and 4b as a mask, ions of an n-type impurity such as P are implanted in the semiconductor substrate 1 to form an n⁻ semiconductor region 6a. By depositing and etching back a silicon oxide film, sidewall insulating films 5 are formed at the side parts of the gate electrodes 4a and 4b.

As subsequent steps, using the gate electrodes 4a and 4b and the sidewall insulating films 5 as a mask, an n-type impurity, for example, P, is implanted to a high concentration compared with the semiconductor region 6a so as to form an n⁺ semiconductor region 6b. Due to this, source/drain regions 6 having LDD structures are formed. By removing the gate insulating films 3 on the source/drain regions 6, the semiconductor device shown in FIG. 1 is produced.

According to the method of producing a semiconductor device according to the present embodiment, since the gate electrode 4a of the high withstand voltage use transistor Tr1 is formed using a silicon film 4-1 formed by the first gate ion implantation, the concentration of impurity of the gate electrode 4a becomes relatively low, that is, becomes lower than the concentration of impurity of the gate electrode 4b. As a result, depletion of the gate electrode readily occurs and a gate insulating film 3 having a thick electrical effective thickness can be obtained. Further, since the gate electrode 4b of the transistor Tr2 from which a high performance is required is formed by using a silicon film 4-2 obtained a second additional high concentration ion implantation, the electrical effective thickness of the gate insulating film 3 can be kept thin. Therefore, the different types of transistor Tr1 and Tr2 can be formed simultaneously and efficiently on the same substrate while maintaining the capabilities of the transistors.

Second Embodiment

Figure 3:
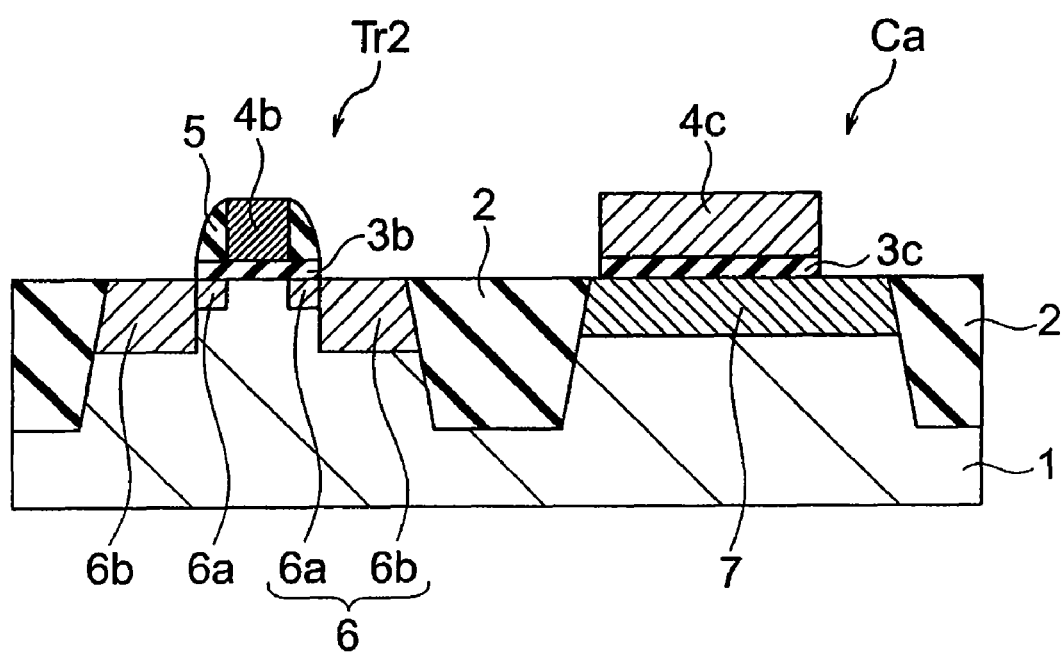
FIG. 3 is a cross-sectional view of an example of a semiconductor device according to a second embodiment.

In this embodiment, a semiconductor device having transistors and capacitors formed on the same substrate will be explained. Components the same as those of the first embodiment are assigned the same notations and explanations thereof are omitted. FIG. 3 is a cross-sectional view of a semiconductor device according to second embodiment.

As shown in FIG. 3, one active region of the substrate 1 is formed with a high performance transistor Tr2 having a high speed and large drive current. The other active region is formed with a capacitor Ca. The capacitor Ca includes a lower electrode 7 formed on the semiconductor substrate 1 and having a high concentration of the n-type impurity, a capacitive insulating film 3c formed on the lower electrode 7, and an upper electrode (capacitor electrode) 4c formed on the capacitive insulating film 3c.

In the present embodiment, the gate insulating film 3b of the transistor Tr2 and the capacitive insulating film 3c of the capacitor Ca are formed simultaneously. Their thicknesses are substantially the same. The gate electrode 4b of the transistor Tr2 is formed by a polycrystalline silicon layer containing the impurity in a high concentration compared with the upper electrode 4c. The upper electrode 4c of the capacitor Ca is formed by a polycrystalline silicon layer containing the impurity in a low concentration compared with the gate electrode 4b. The gate electrode 4b and the upper electrode 4c are formed simultaneously.

In the semiconductor device according to the present embodiment, since the upper electrode 4c of the high withstand voltage use capacitor Ca designed for the capacitor voltage includes the impurity in a relatively low concentration, depletion of the upper electrode 4c easily occurs at the time of application of voltage in this structure. The depletion of the upper electrode 4c is equivalent to making the thickness of the capacitive insulating film 3c thicker. The capacitor Ca is required to have a thickness of the capacitive insulating film thicker enough to be able to withstand a high voltage. By utilizing the depletion of the capacitive electrode 4c, the electrical effective thickness required of the capacitive insulating film 3c can be made thicker.

On the other hand, the gate electrode 4b of the high performance transistor Tr2 from which a high speed and large drive current are required includes the impurity in a high concentration so that depletion of the gate electrode 4b does not occur, so the electrical effective thickness of the gate insulating film 3b is kept thin. Therefore, it is possible to prevent obstruction of the high speed operation due to depletion of the gate electrode and possible to realize a high speed and large drive current.

Next, a method of producing a semiconductor device according to the present embodiment will be described referring to FIGS. 4A to 4F.

Figure 4A:
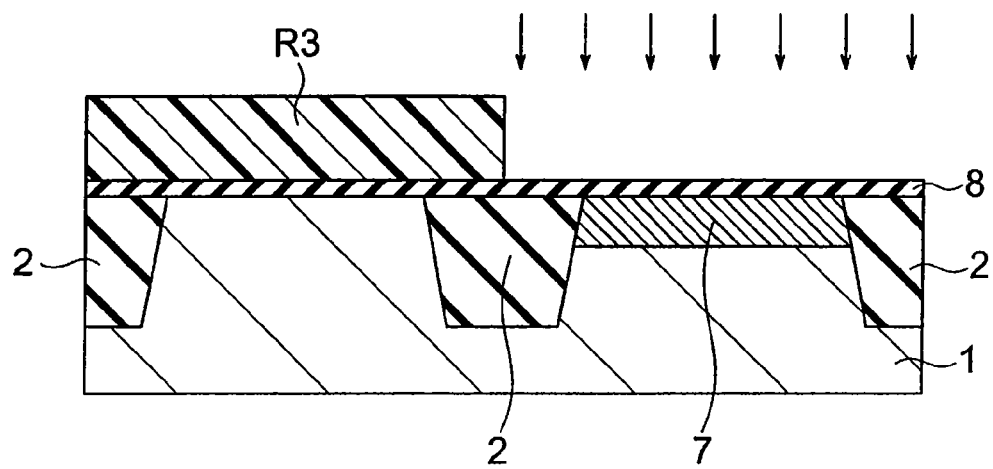
FIGS. 4A to 4F are cross-sectional views of steps of producing a semiconductor device according to the second embodiment.

First, as shown in FIG. 4A, a semiconductor substrate 1 separated into active regions by an element-isolation insulating film 2 formed by LOCOS or STI is formed with a sacrificial film 8 of silicon oxide by heat oxidation. The thickness of the sacrificial film 8 is for example about 8 nm. Next, a resist R3 opening at the capacitor formation region is patterned. By implanting ions using this resist R3 as a mask, a bottom electrode 7 is formed. The dosage at this time is one sufficient for conversion to an $n^+$ or $p^+$ form, but not increasing the gate leakage current or increasing the crystal defects and lowering reliability. For example, As ions are implanted at an implantation energy of 70 keV and a dosage of $1\times10^{15}$ cm$^{-2}$.

Figure 4B:
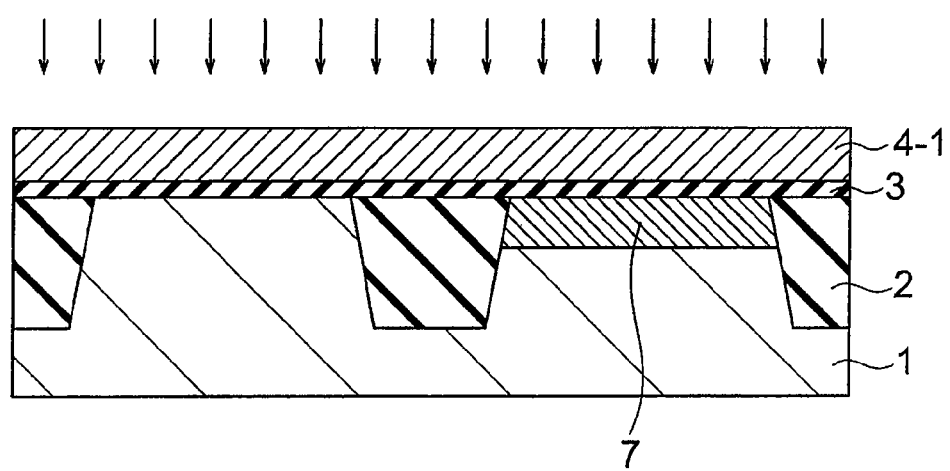

Next, as shown in FIG. 4B, the resist film R3 is removed and the sacrificial film 8 is removed by a hydrofluoric acid solution. The insulating film 3 for forming the capacitive insulating film of the capacitor Ca and a gate insulating film of the later formed transistor Tr2 is formed by heat oxidation. The oxidation conditions at this time are set so that the oxide film thickness becomes a thickness suitable for the transistor Tr2 for which the highest performance is required. Next, an amorphous silicon film 4-1 is formed. The thickness of the silicon film 4-1 is for example about 50 to 200 nm. Further, ions are implanted to form an $n^+$ electrode. This ion implantation is implantation of P by an implantation energy of 20 keV and a dosage of $1\times10^{15}$ cm$^{-2}$. The dosage at this time is made one so that gate depletion becomes easier for an element for which a thick electrical capacitive insulating film is required such as a capacitor Ca for a high power source voltage.

Figure 4C:
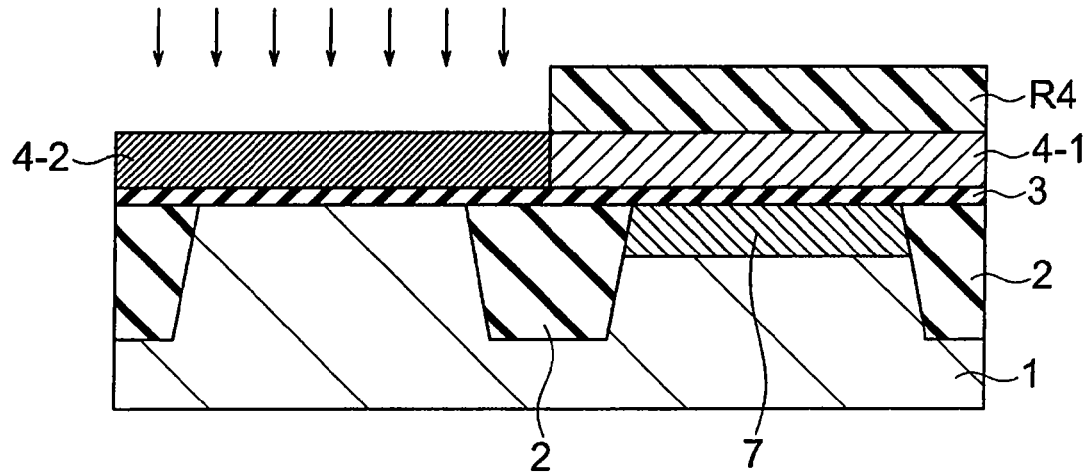

The following steps are the same as the steps from FIG. 2C explained in the first embodiment. That is, as shown in FIG. 4C, a resist R4 opening at the region including the gate electrode of the transistor Tr2 from which a high performance is sought is patterned. Using this resist R4 as a mask, additional ions are implanted. Due to this, a silicon film 4-2 containing an impurity in a high concentration compared with the silicon film 4-1 is formed. The detailed conditions of the additional gate ion implantation are similar to those of the additional gate ion implantation of the first embodiment. The resist R4 is removed, then the implanted impurity is activated by heat treatment. Due to this heat treatment, the amorphous silicon films 4-1 and 4-2 become polycrystalline silicon.

Figure 4D:
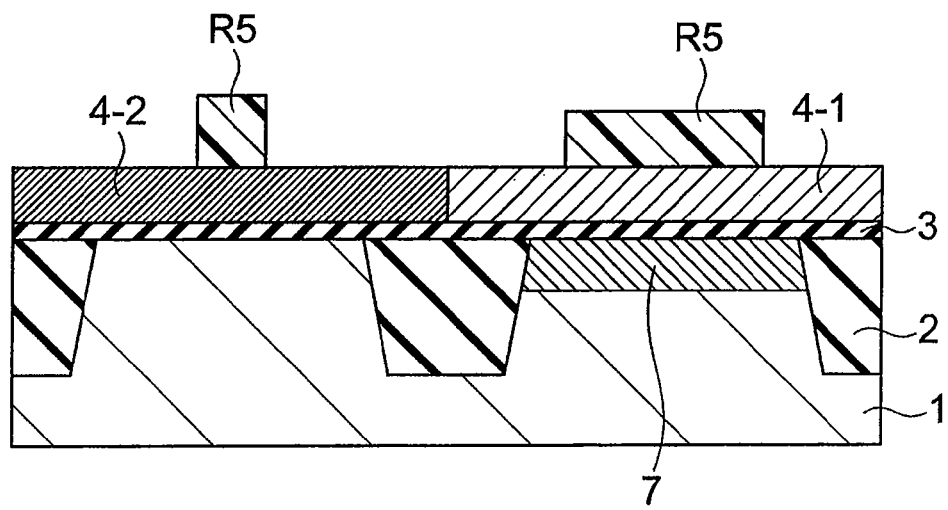
Figure 4E:
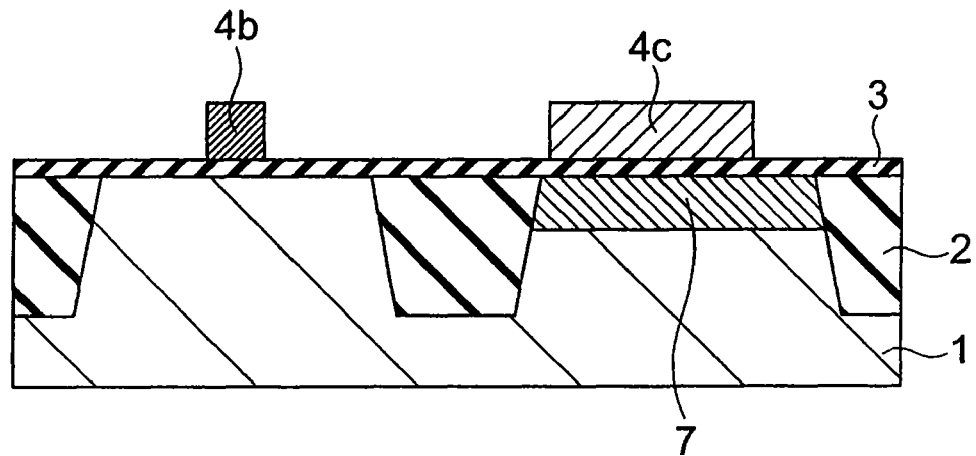

Next, as shown in FIG. 4D, the part for forming the gate electrode of the transistor Tr2 and the part for forming the upper electrode of the capacitor Ca are masked by a resist R5, then, as shown in FIG. 4E, the silicon films 4-1 and 4-2 are dry-etched using the resist R5 as a mask. After that, the resist R5 is removed. Due to this, the upper electrode 4c of the silicon film 4-1 containing an impurity in a low concentration compared with the silicon film 4-2 and the gate electrode 4b of the silicon film 4-2 formed by two ion implantations and containing an impurity in high concentration of the impurity compared with the silicon film 4-1 are formed.

Figure 4F:
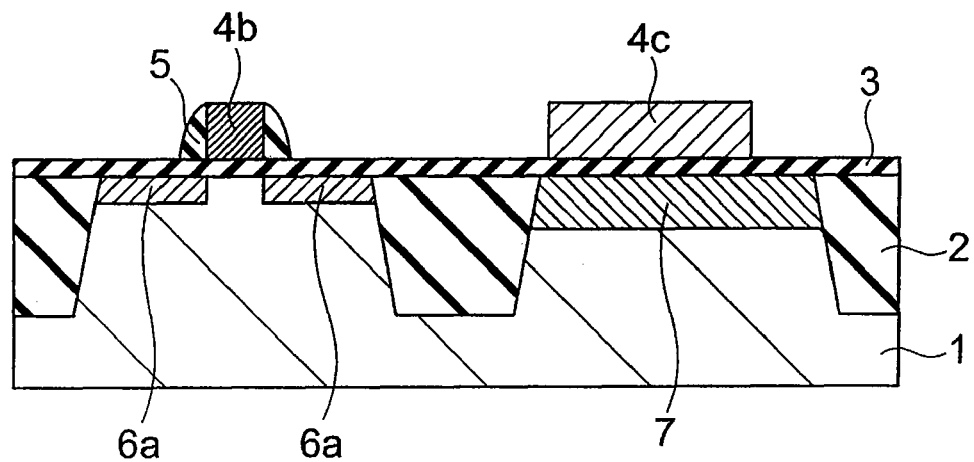

Next, as shown in FIG. 4F, in the state masking the capacitor formation region by a resist, an n-type impurity, for example P, is implanted at the transistor formation region of the semiconductor substrate 1 using the gate electrode 4b as a mask to form an $n^-$ semiconductor region 6a. The resist is removed, then for example a silicon oxide film is deposited and etched back to form sidewall insulating films 5 at the side parts of the gate electrode 4b.

As the following steps, in the state masking the capacitor formation region by a resist, an n-type impurity, for example P, is implanted at the transistor formation region in a high concentration compared with the semiconductor region 6a using the gate electrode 4b and the sidewall insulating film 5 as a mask to form an $n^+$ semiconductor region 6b. Due to this, a source/drain region 6 having an LDD structure is formed. The exposed parts of the insulating film 3 are removed to form the gate insulating film 3b of the transistor Tr2 and the capacitive insulating film 3c of the capacitor Ca, whereby the semiconductor device shown in FIG. 3 is produced.

According to the method of producing a semiconductor device according to the present embodiment, by forming a capacitor having the upper electrode 4c formed by the silicon film 4-1 obtained by the first low concentration gate ion implantation, the concentration of impurity of the upper electrode 4c becomes lower compared with the gate electrode 4b. As a result, depletion of the upper electrode easily occurs and it is possible to obtain a capacitive insulating film 3c having the thick effective thickness. Further, since the gate electrode 4b of the transistor Tr2 from which a high performance is required is formed by using the silicon film 4-2 additionally implanted with ions to a high concentration a second time, the thin electrical effective thickness of the gate insulating film 3 is maintained as thin. Therefore, it is possible to efficiently and simultaneously prepare capacitors using different power source voltages on the same substrate while maintaining the capacity of the high performance transistor Tr2.

Third Embodiment

Figure 5:
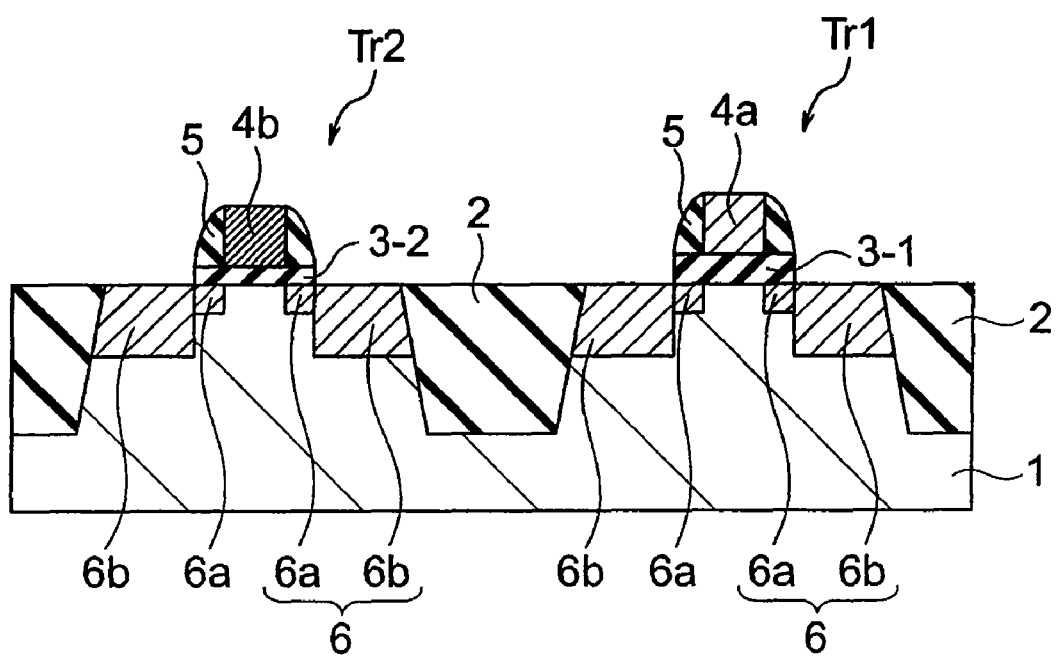
FIG. 5 is a cross-sectional view of an example of a semiconductor device according to a third embodiment.

FIG. 5 is a cross-sectional view of a semiconductor device according to a third embodiment. Note that components the same as those of the first embodiment are assigned the same notations and their explanations are omitted.

In the first embodiment, an explanation was given of an example wherein the thicknesses of the gate insulating films of the transistor Tr1 and the transistor Tr2 were the same. In the third embodiment, as shown in FIG. 5, use is also made of separate formation of gate insulating films so that the physical thickness of the gate insulating film 3-1 of the high withstand voltage use transistor Tr1 becomes thicker than the gate insulating film 3-2 of the transistor Tr2.

Therefore, combined with use of the depletion of the gate electrode 4a, the effective thickness of the gate insulating film can be thicker. Further, by forming gate insulating films having two different types of thickness by separate formation of gate insulating films and further utilizing depletion of the gate electrode 4a, it is possible to form gate insulating films having three types of electrical effective thickness. For the rest, similar effects are exhibited as with the first embodiment.

Next, a method of producing a semiconductor device according to the present embodiment will be described with reference to FIGS. 6A to 6I. In the present embodiment, a step of separate formation of gate insulating films is performed before the step shown in FIG. 2A in the first embodiment.

Figure 6A:
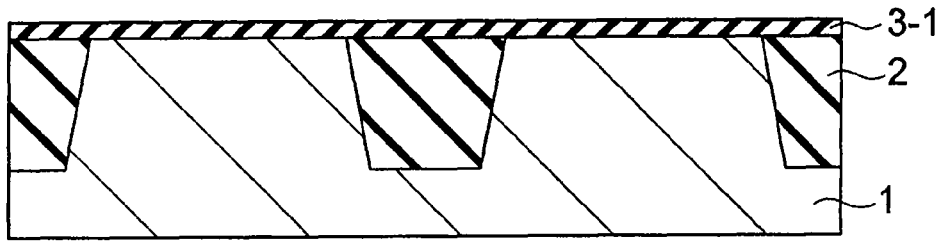
FIGS. 6A to 6I are cross-sectional views of steps of producing a semiconductor device according to the third embodiment.

That is, as shown in FIG. 6A, a semiconductor substrate 1 separated into active regions by an element-isolation insulating film 2 formed by LOCOS or STI is formed with a gate insulating film 3-1 of silicon oxide by heat oxidation.

Figure 6B:
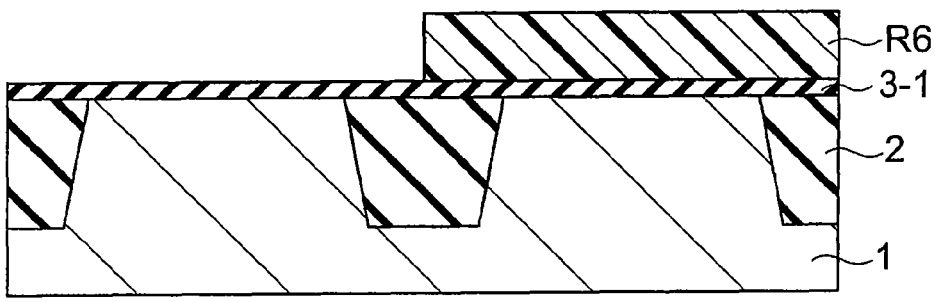
Figure 6C:
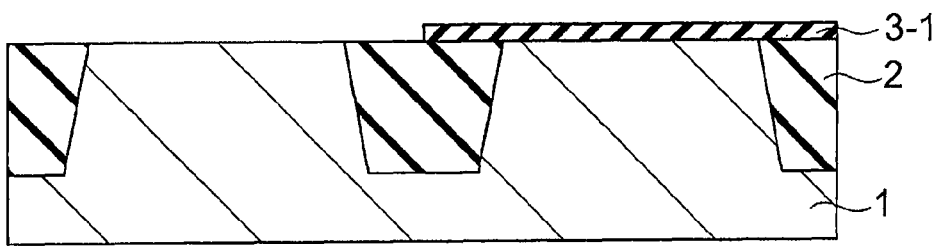

Next, as shown in FIG. 6B, only the transistor region where a thick gate insulating film is required is masked using a resist R6, then as shown in FIG. 6C, the film is wet-etched using a hydrofluoric acid solution etc. to remove all of the parts of the gate insulating film 3-1 with no resist. After this, the resist R6 is removed.

Figure 6D:
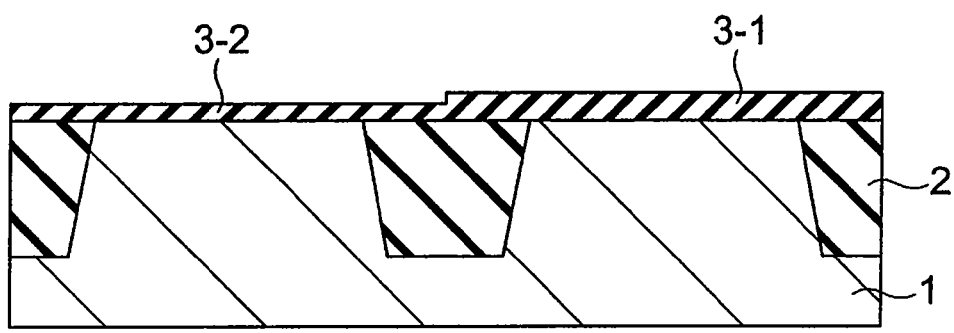

Next, as shown in FIG. 6D, a second heat oxidation is performed. Due to this, the semiconductor substrate 1 stripped of the gate insulating film 3-1 is formed with a gate insulating film 3-2 by the second heat oxidation, whereby the existing gate insulating film 3-1 is made thicker. Note that the total oxide film thickness due to the two heat oxidations does not become the simple sum, so for the first heat oxidation, the thickness giving the desired thickness as the total is calculated in reverse and suitable heat oxidation performed. That is, when the first heat oxidation forms a gate insulating film 3-1 of for example 4 nm and the second heat oxidation forms a gate insulating film 3-2 of 2 nm, the thickness of the gate insulating film 3-1 becomes for example about 5 nm by the two heat oxidations.

Figure 6E:
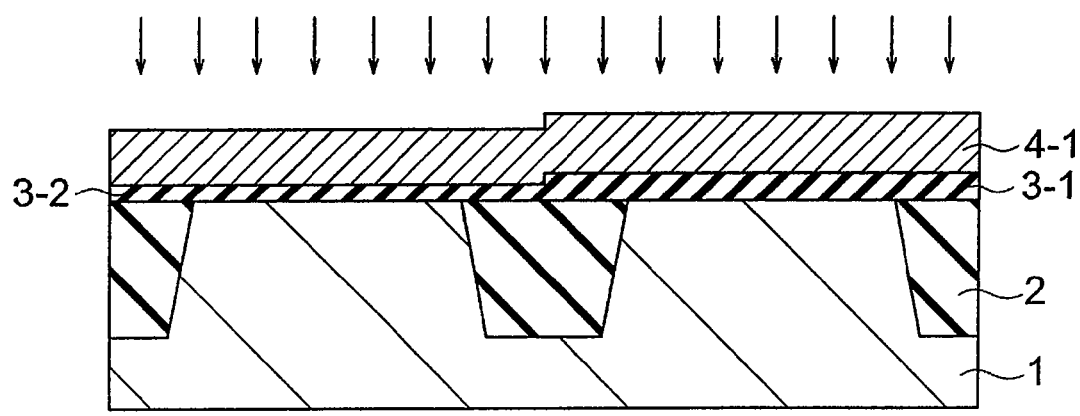

The following steps are similar to the steps from FIG. 2B explained in the first embodiment. That is, as shown in FIG. 6E, an amorphous silicon film 4-1 is formed on the gate insulating films 3-1 and 3-2. The thickness of the silicon film 4-1 is made for example about 50 to 200 nm. Next, gate ions are implanted for forming an $n^+$ electrode. The gate ion implantation condition is implantation of for example P by an implantation energy of 20 keV and a dosage of $1 \times 10^{15}$ cm$^{-2}$. The dosage at this time is made a concentration further facilitating gate depletion suitable for a element for which a thick gate insulating film is required such as a high withstand voltage use transistor Tr1.

Figure 6F:
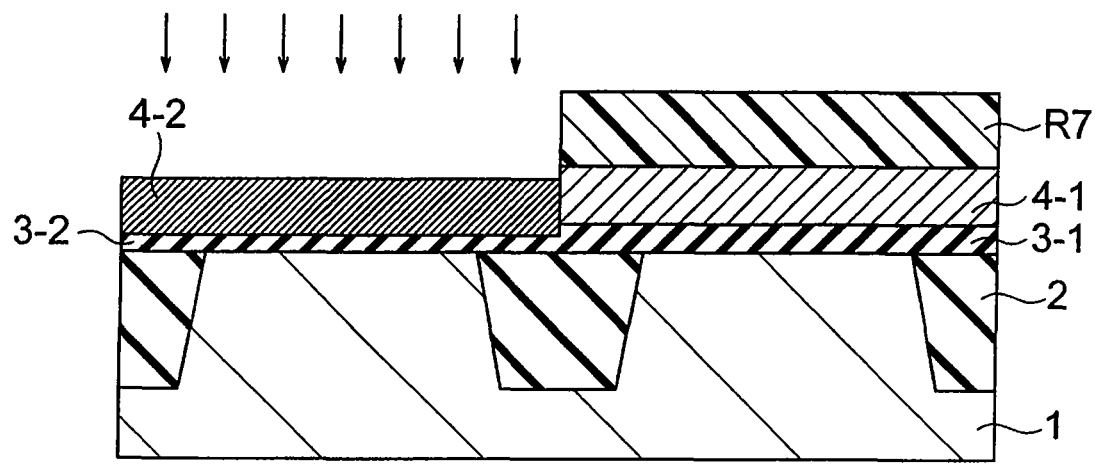

Next, as shown in FIG. 6F, a resist R7 opening at the region including the gate electrode of the transistor Tr2 for which the highest performance is sought is patterned, then additional gate ions are implanted using this resist R7 as a mask. Due to this, a silicon film 4-2 containing an impurity in a high concentration is formed. This additional gate ion implantation is implantation of for example P at an implantation energy of 20 keV and a dosage of $3 \times 10^{15}$ cm$^{-2}$. The dosage at this time is set to one of a sufficiently high concentration for making gate depletion difficult so that the electrical effective thickness of the gate insulating film required of the transistor Tr2 from which the highest performance is sought does not become thicker. The resist R7 is removed, then the implanted impurity is activated by heat treatment. Due to the heat treatment, amorphous silicon films 4-1 and 4-2 become polycrystalline silicon.

Figure 6G:
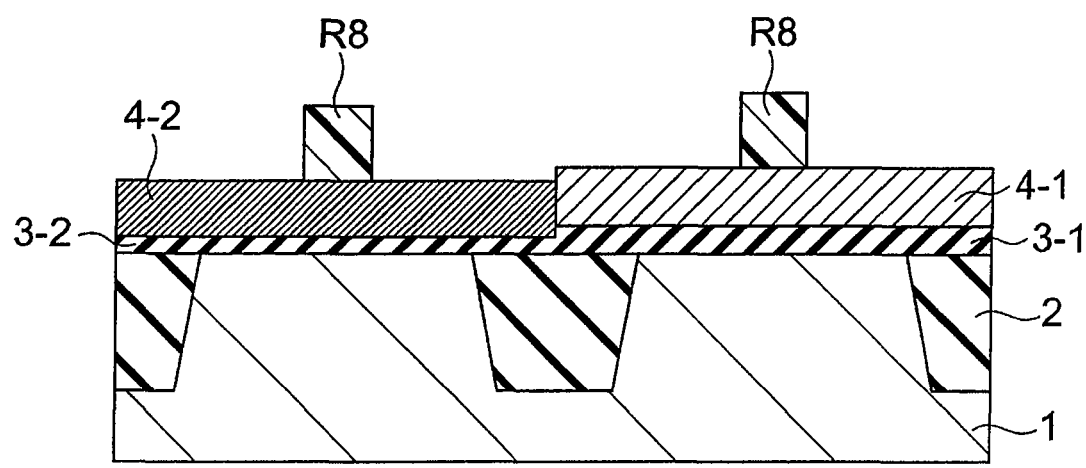
Figure 6H:
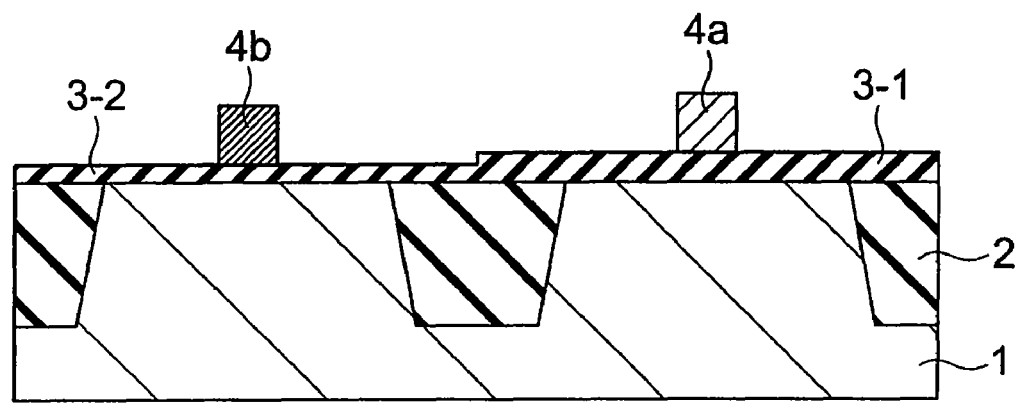

Next, as shown in FIG. 6G, the parts for forming the gate electrodes of the transistors Tr1 and Tr2 are masked by a resist R8, then, as shown in FIG. 6H, the silicon films 4-1 and 4-2 are dry-etched using the resist R8 as a mask. After that, the resist R8 is removed. Due to this, a gate electrode 4a of the silicon film 4-1 containing an impurity in a low concentration compared with the silicon film 4-2 and a gate electrode 4b of the silicon film 4-2 containing an impurity in a high concentration compared with the silicon film 4-1 by two ions implantations are formed.

Figure 6I:
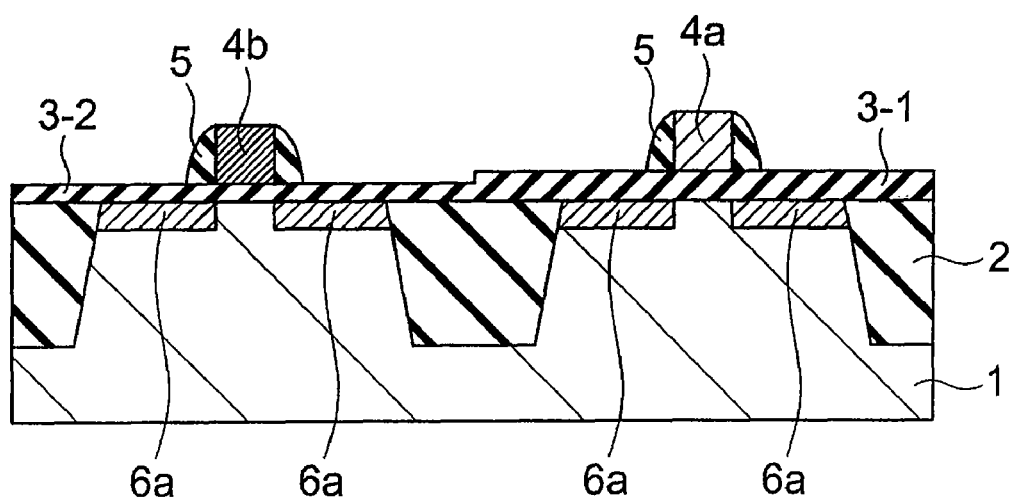

Next, as shown in FIG. 6I, an n-type impurity, for example, P, is implanted at the semiconductor substrate 1 using the gate electrodes 4a and 4b as a mask to form n$^-$ semiconductor regions 6a in the semiconductor substrate 1. By depositing and etching back for example a silicon oxide film, sidewall insulating films 5 are formed at the side parts of the gate electrodes 4a and 4b.

As the following steps, an n-type impurity, for example, P, is implanted in a high concentration compared with the semiconductor regions 6a using the gate electrodes 4a and 4b and the sidewall insulating films 5 as a mask to form n$^+$ semiconductor regions 6b. By this, source/drain regions 6 having LDD structures are formed. By removing the gate insulating films 3-1 and 3-2 on the source/drain regions 6, the semiconductor device shown in FIG. 5 is produced.

According to the method of producing a semiconductor device of the present embodiment, since the gate electrode 4a of the high withstand voltage use transistor Tr1 is formed by using the silicon film 4-1 by a first low concentration gate ion implantation plus use of the gate insulating film 3-1 thicker than the oxide film 3-2 formed by separation formation of gate insulating films, the electrical effective thickness required from the gate insulating films can be made thicker than the first embodiment. Therefore, the reliability of the transistors can be raised. Further, by separately forming gate insulating films with two different types of physical thicknesses and utilizing depletion of the gate electrode 4a, it is possible to efficiently simultaneously produce three types of transistors on the same substrate while maintaining the capability of the transistors. Otherwise, the same effects as in the first embodiment can be obtained.

Fourth Embodiment

Figure 7:
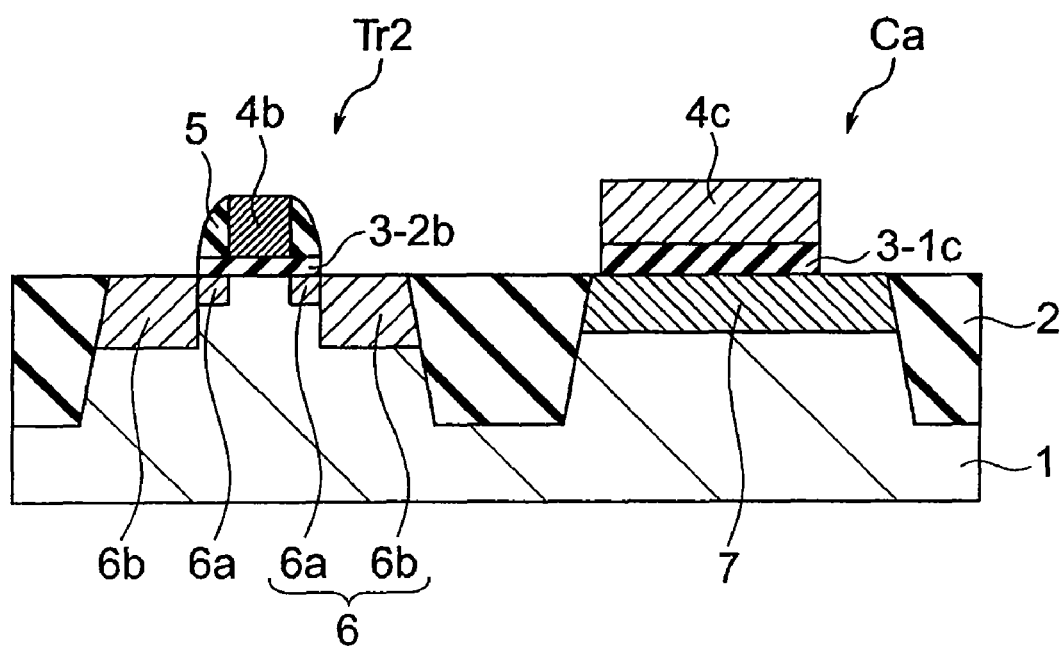
FIG. 7 is a cross-sectional view of an example of a semiconductor device according to a fourth embodiment.

FIG. 7 is a cross-sectional view of a semiconductor device according to a fourth embodiment. Note that components the same as those of the second embodiment are assigned the same notations and their explanations are omitted.

In the second embodiment, the explanation was given of the example of the same thicknesses of the gate insulating film of the transistor Tr2 and the capacitive insulating film of the capacitor Ca. In the present embodiment, as shown in FIG. 7, separation formation of the gate insulating films is used so that the physical thickness of the capacitive insulating film 3-1c of the high withstand voltage use capacitor Ca is formed thick compared with the gate insulating film 3-2b of the transistor Tr2.

Therefore, along with utilization of depletion of the upper electrode 4c of the capacitor, it is possible to further increase the electrical effective thickness required of a capacitive insulating film. Otherwise, effects similar to those of the first embodiment are exhibit.

Next, a method of producing a semiconductor device according to the present embodiment will be described with reference to FIGS. 8A to 8I. In the present embodiment, the step of separate formation of the gate insulating films is performed before the steps of FIG. 4A and FIG. 4B in the second embodiment.

Figure 8A:
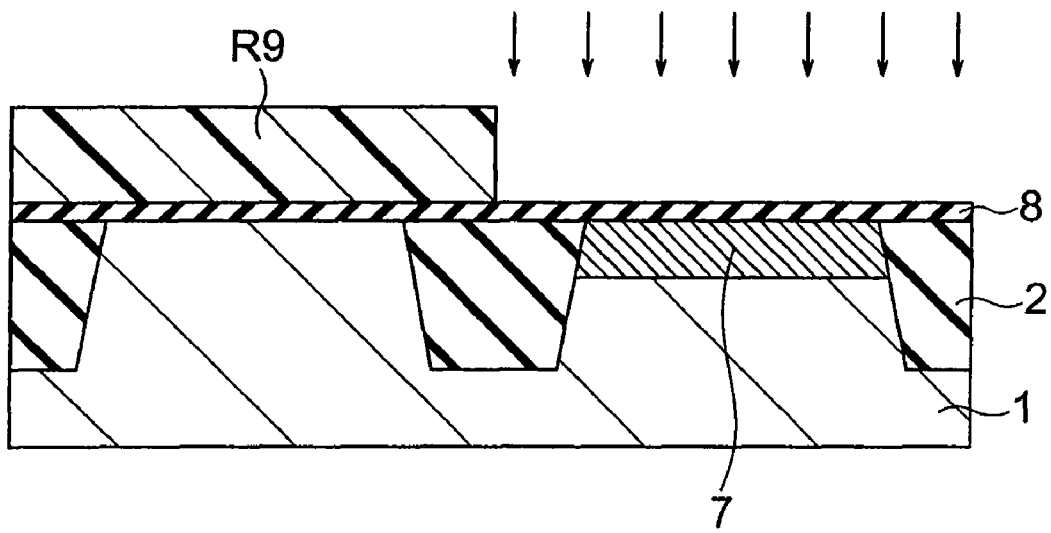
FIGS. 8A to 8J are cross-sectional views of steps of producing a semiconductor device according to the fourth embodiment.

That is, as shown in FIG. 8A, a semiconductor substrate 1 separated into active regions by an element-isolation insulating film 2 formed by LOCOS or STI is formed with a sacrificial film 8 of silicon oxide by heat oxidation. The thickness of the sacrificial film 8 is for example about 8 nm. Next, a resist R9 opening at the capacitor formation region is patterned. By implanting ions using this resist R9 as a mask, a bottom electrode 7 is formed. The dosage at this time is one sufficient for conversion to an n$^+$ or p$^+$ form, but not increasing the gate leakage current or increasing the crystal defects and lowering reliability. For example, As ions are implanted at an implantation energy of 70 keV and a dosage of $1\times10^{15}$ cm$^{-2}$.

Figure 8B:
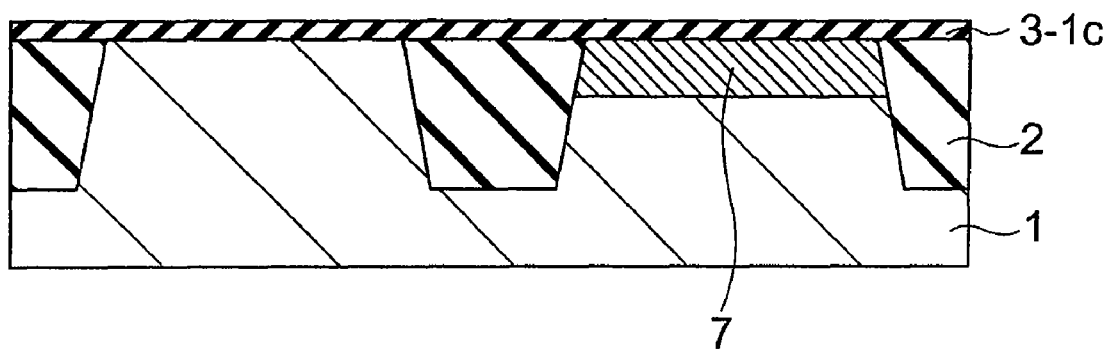

Next, as shown in FIG. 8B, the resist film R9 is removed and the sacrificial film 8 is removed by a hydrofluoric acid solution, then the insulating film 3-1c for forming the capacitive insulating film of the capacitor Ca is formed by heat oxidation.

Figure 8C:
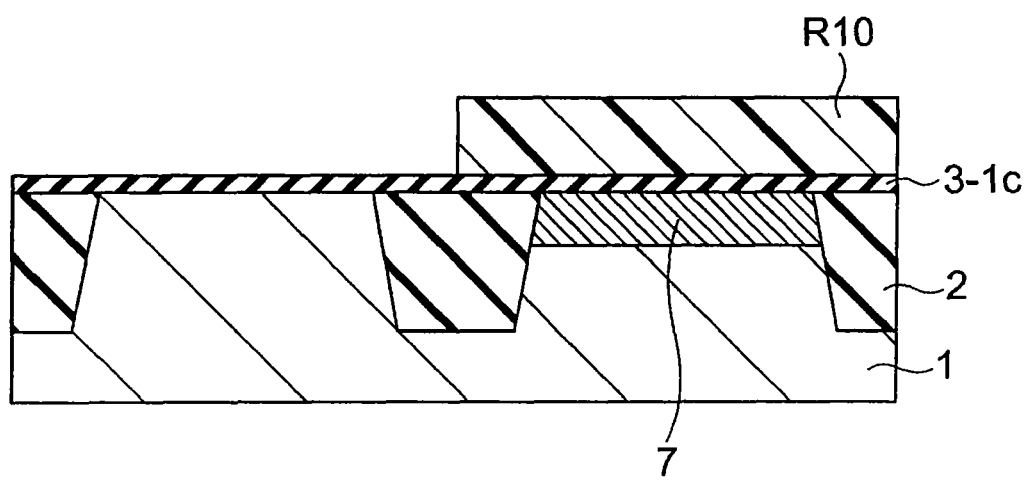
Figure 8D:
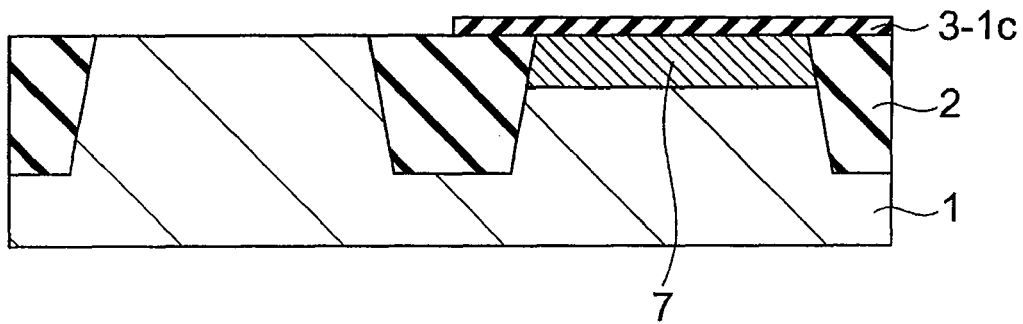

Next, as shown in FIG. 8C, only the capacitor region where a thick gate insulating film is required is masked using a resist R10, then as shown in FIG. 8D, the film is wet-etched using a hydrofluoric acid solution etc. to remove all of the parts of the gate insulating film 3-1c with no resist. After this, the resist R10 is removed.

Figure 8E:
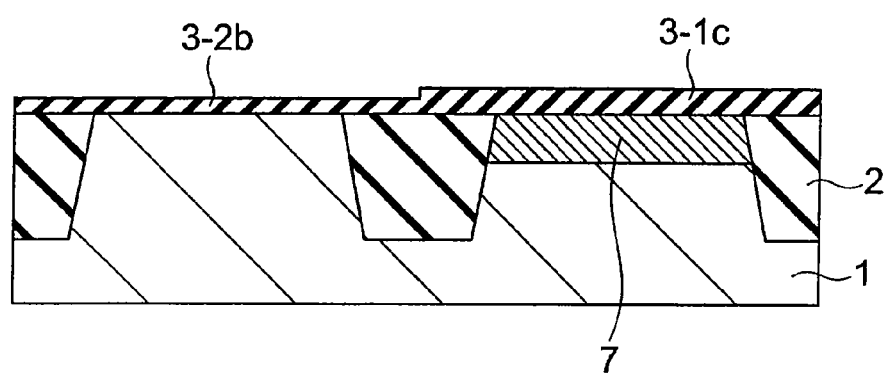

Next, as shown in FIG. 8E, a second heat oxidation is performed. Due to this, the semiconductor substrate 1 stripped of the gate insulating film 3-1 is formed with a gate insulating film 3-2 by the second heat oxidation, whereby the existing gate insulating film 3-1c is made thicker. Note that as explained in the third embodiment, the total oxide film thickness due to the two heat oxidations does not become the simple sum, so for the first heat oxidation, the thickness giving the desired thickness as the total is calculated in reverse and suitable heat oxidation performed.

Figure 8F:
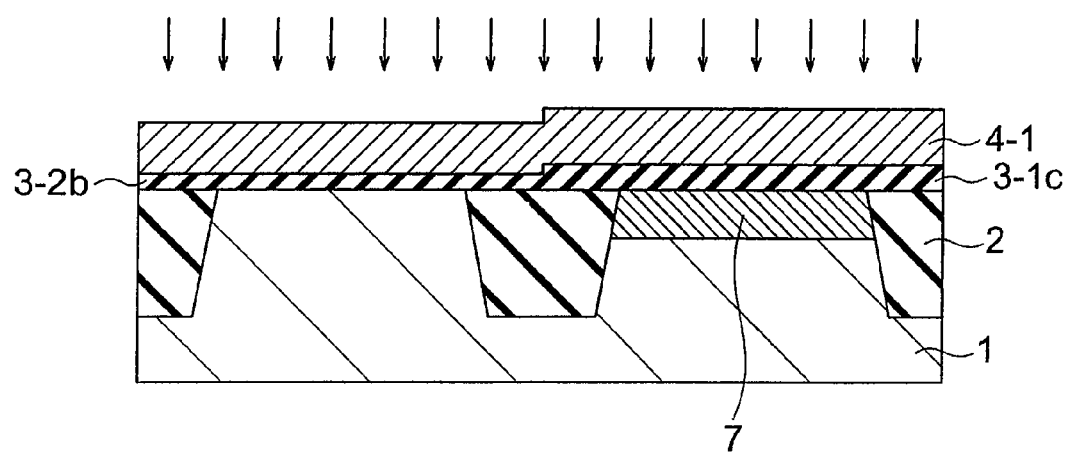

The following steps are similar to the steps from FIG. 4B explained in the second embodiment. That is, as shown in FIG. 8F, an amorphous silicon film 4-1 is formed on the gate insulating film 3-2b and the capacitive insulating film 3-1c. The thickness of the silicon film 4-1 is made for example about 50 to 200 nm. Next, ions are implanted for forming an n$^+$ electrode. The ion implantation is implantation of for example P by an implantation energy of 20 keV and a dosage of $1\times10^{15}$ cm$^{-2}$. The dosage at this time is made a low concentration further facilitating gate depletion suitable for an element for which a thick capacitive insulating film is required such as a high power source voltage capacitor Ca.

Figure 8G:
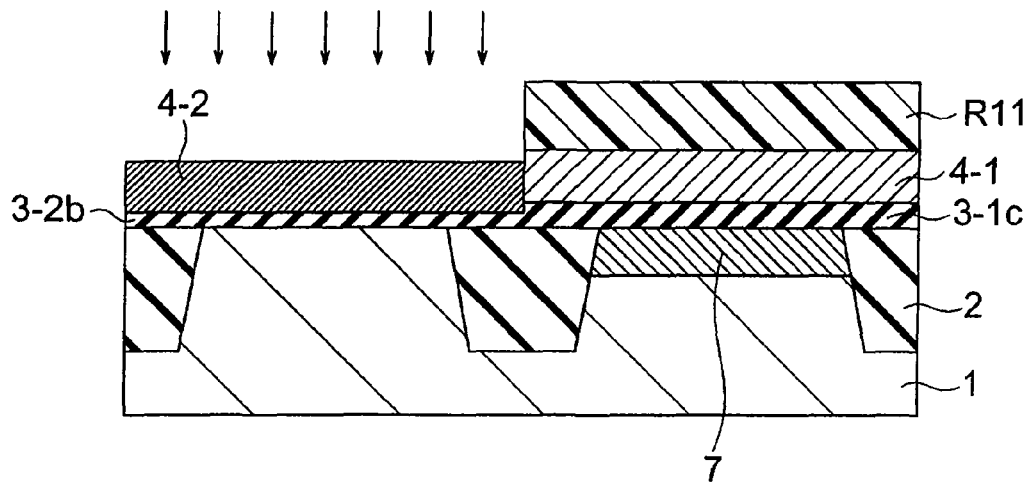

Next, as shown in FIG. 8G, a resist R11 opening at the region including the gate electrode of the transistor Tr2 is patterned. Using this resist R11 as a mask, additional ions are implanted. Due to this, a silicon film 4-2 containing an impurity in a high concentration is formed. The detailed conditions of the additional gate ion implantation are similar to those of the additional gate ion implantation of the first embodiment. The resist R11 is removed, then the implanted impurity is activated by heat treatment. Due to this heat treatment, the amorphous silicon films 4-1 and 4-2 become polycrystalline silicon.

Figure 8H:
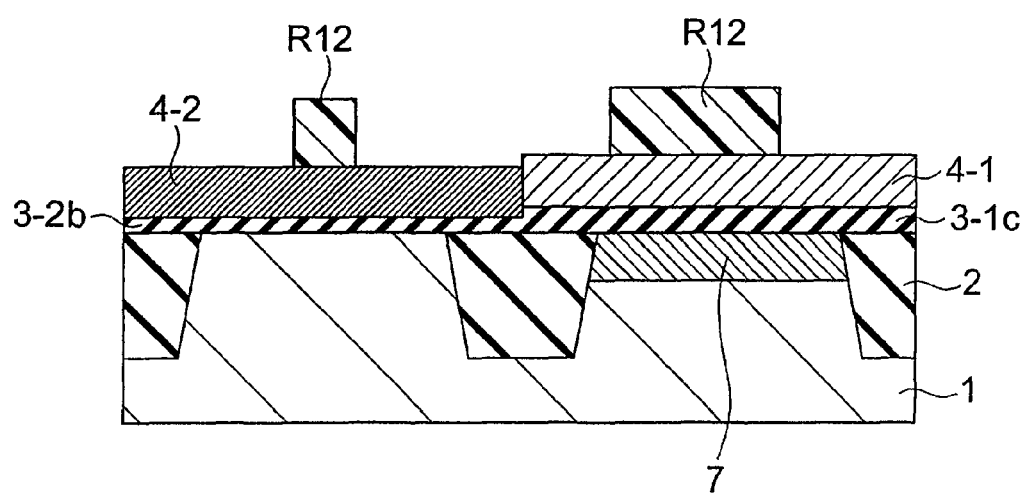
Figure 8I:
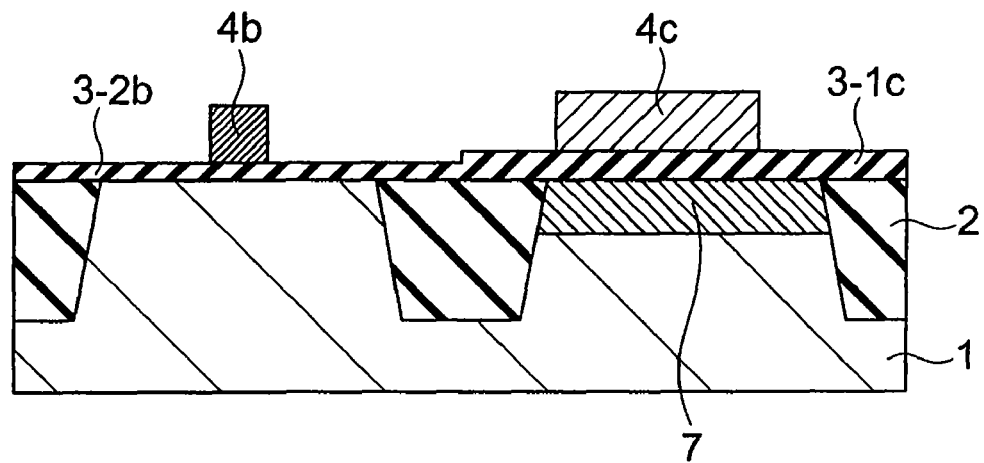

Next, as shown in FIG. 8H, the part for forming the gate electrode of the transistor Tr2 and the part for forming the upper electrode of the capacitor Ca are masked by a resist R12, then, as shown in FIG. 8I, the silicon films 4-1 and 4-2 are dry-etched using the resist R12 as a mask. After that, the resist R12 is removed. Due to this, the upper electrode 4c of the silicon film 4-1 containing an impurity in a low concentration compared with the silicon film 4-2 and the gate electrode 4b of the silicon film 4-2 formed by two ion implantations and containing an impurity in high concentration of the impurity compared with the silicon film 4-1 are formed.

Figure 8J:
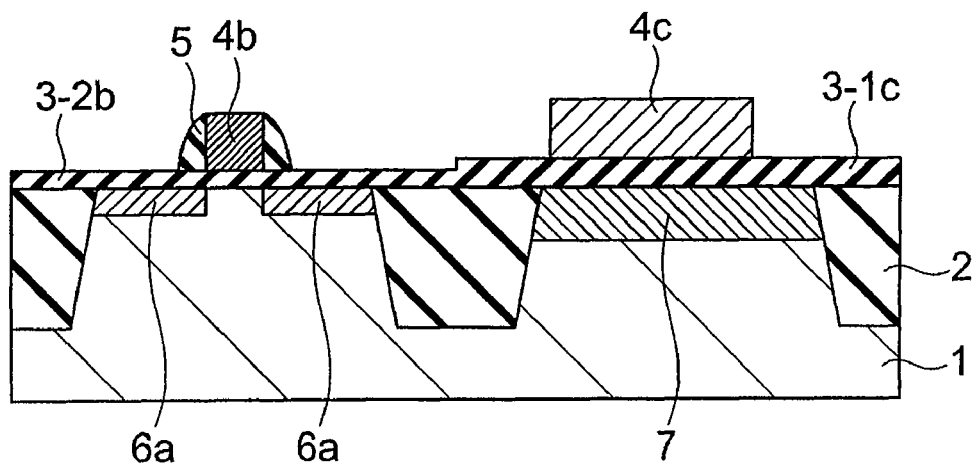

Next, as shown in FIG. 8J, in the state masking the capacitor formation region by a resist, an n-type impurity, for example P, is implanted at the transistor formation region of the semiconductor substrate 1 using the gate electrode 4b as a mask to form an n$^-$ semiconductor region 6a. The resist is removed, then for example a silicon oxide film is deposited and etched back to form sidewall insulating films 5 at the side parts of the gate electrode 4b.

As the following steps, in the state masking the capacitor formation region by a resist, an n-type impurity, for example P, is implanted at the transistor formation region in a high concentration compared with the semiconductor region 6a using the gate electrode 4b and the sidewall insulating film 5 as a mask to form an n$^+$ semiconductor region 6b. Due to this, a source/drain region 6 having an LDD structure is formed. The exposed parts of the insulating films 3-2b and 3-1c are removed to form the gate insulating film 3-2b of the transistor Tr2 and the capacitive insulating film 3-1c of the capacitor Ca, whereby the semiconductor device shown in FIG. 7 is produced.

According to the method of producing a semiconductor device according to the present embodiment, by separately preparing insulating films for forming the gate insulating film and capacitive insulating film and utilizing depletion of the upper electrode, it is possible to make electrical effective thickness of the capacitor thicker than the second embodiment. Therefore, it is possible to form a capacitor having the desired capacity without increasing the leakage current due to crystal defects caused by damage received at the time of high concentration ion implantation for forming the bottom electrode and without a decline in the reliability.

The present invention is not limited to the above embodiments. In the embodiments, the explanation was given with reference to an example of simultaneously forming the transistor Tr1 and the transistor Tr2 having different electrical effective thicknesses required of the gate insulating film and an example of simultaneously forming the transistor Tr2 and the capacitor, but it is also possible to simultaneously form the transistor Tr1, the transistor Tr2, and the capacitor Ca. Further, the explanation was given of an example of the configuration of transistors and capacitors, but the invention is not limited to this. The sidewall insulating film etc. may be omitted. In addition, the numerical values and materials mentioned in the embodiments are examples. The invention is not limited to this.

Summarizing the effects of the invention, according to the semiconductor device of the present invention, it is possible to secure electrical effective thicknesses required for insulating films of electronic circuit elements by using depletion of electrodes of the electronic circuit elements even if the physical thicknesses of the insulating films are not different.

According to the method of producing a semiconductor device of the present invention, it is possible to secure electrical effective thicknesses required for gate oxide films of transistors and capacitive insulating films of capacitors while keeping down the increase in number of steps due to the selective formation of insulating films with physically different thicknesses.

While the invention has been described with reference to specific embodiments chosen for purpose of illustration, it should be apparent that numerous modifications could be made thereto by those skilled in the art without departing from the basic concept and scope of the invention.

What is claimed is:

1. A method of producing a semiconductor device including forming gate electrodes of a plurality of transistors supplied with different voltages on a semiconductor substrate via a gate insulating film, comprising the steps of:
    forming said gate insulating film on said semiconductor substrate;
    forming a gate electrode layer containing an impurity on said gate insulating film;
    implanting an additional impurity at regions of said gate electrode layer for forming transistors where the electrical effective thickness required of said gate insulating film based on said voltage is relatively thin; and processing said gate electrode layer to form gate electrodes with concentrations of impurities differing for each transistor, wherein, a height of said gate insulating film is different between regions for forming transistors having relatively thin effective thicknesses of said gate insulating film and regions for forming transistors having relatively thick effective thicknesses of said gate insulating film, and said step of implanting the additional impurity comprises selecting the regions of the electrode layer in accordance with said height of said gate insulating film.

2. A method of producing a semiconductor device as set forth in claim 1, wherein the step of forming said gate electrode layer comprises the steps of:

forming an amorphous silicon layer on said gate insulating film and implanting the impurity in said amorphous silicon layer.

3. A method of producing a semiconductor device for forming gate electrodes of a plurality of transistors supplied with different voltages on a semiconductor substrate via a gate insulating film, comprising the steps of:

forming said gate insulating film on said semiconductor substrate;

forming a gate electrode layer containing an impurity on said gate insulating film;

implanting an additional impurity at regions of said gate electrode layer for forming transistors where the electrical effective thickness required of said gate insulating film based on said voltage is relatively thin; and processing said gate electrode layer to form gate electrodes with concentrations of impurities differing for each transistor, wherein, the step of forming said gate insulating film comprises forming on said semiconductor substrate said gate insulating film with different thicknesses between regions for forming transistors having relatively thin effective thicknesses of said gate insulating film and regions for forming transistors having relatively thick effective thicknesses of said gate insulating film.

4. A method of producing a semiconductor device including forming gate electrodes of transistors and upper electrodes of capacitors on a semiconductor substrate, comprising the steps of:

forming lower electrodes of said capacitors in said semiconductor substrate;

forming an insulating film to provide gate insulating films of said transistors and capacitive insulating films of said capacitors on said semiconductor substrate and said lower electrodes;

forming an electrode layer containing an impurity for forming said gate electrodes and said upper electrodes on said insulating film;

implanting an additional impurity at regions of said electrode layer for forming transistors where the effective thickness required of said insulating film is relatively thin compared with said capacitors; and processing said electrode layer to form said gate electrodes and said upper electrodes having different concentrations of impurities, wherein, a height of said gate insulating film from said semiconductor substrate is different between regions for forming the gate insulating films of said transistors and regions for forming capacitive insulating films of said capacitors, and said step of implanting the additional impurity comprises selecting the regions of the electrode layer in accordance with said height of said gate insulating film.

5. A method of producing a semiconductor device as set forth in claim 4, wherein the step of forming said lower electrodes comprises the steps of:

forming a sacrificial film on said semiconductor substrate;

implanting an impurity via said sacrificial film in regions of said semiconductor substrate for forming said capacitors so as to form said lower electrodes; and removing said sacrificial film.

6. A method of producing a semiconductor device as set forth in claim 4, wherein the step of forming said electrode layer comprises the steps of:

forming an amorphous silicon layer on said insulating film and implanting the impurity in said amorphous silicon layer.

7. A method of producing a semiconductor device for forming gate electrodes of transistors and upper electrodes of capacitors on a semiconductor substrate, comprising the steps of:

forming lower electrodes of said capacitors in said semiconductor substrate;

forming an insulating film to provide gate insulating films of said transistors and capacitive insulating films of said capacitors on said semiconductor substrate and said lower electrodes;

forming an electrode layer containing an impurity for forming said gate electrodes and said upper electrodes on said insulating film;

implanting an additional impurity at regions of said electrode layer for forming transistors where the effective thickness required of said insulating film is relatively thin compared with said capacitors; and processing said electrode layer to form said gate electrodes and said upper electrodes having different concentrations of impurities;

wherein, the step of forming said insulating film comprises forming said insulating film with different thicknesses between regions for forming the gate insulating films of said transistors and regions for forming capacitive insulating films of said capacitors.

8. The method of claim 1, wherein the additional impurity is of the same type as that of the impurity contained in the gate electrode layer.

9. The method of claim 4, wherein the additional impurity is of the same type as that of the impurity contained in the gate electrode layer.

10. The method of claim 1, wherein the additional impurity is different than the impurity contained in the gate electrode layer.

11. The method of claim 1, wherein the additional impurity is different than the impurity contained in the gate electrode layer.

* * * * *